US005360757A

United States Patent [19]

Lage

[11] Patent Number: 5,360,757
[45] Date of Patent: Nov. 1, 1994

[54] PROCESS FOR FABRICATING A SELF ALIGNED INTERCONNECT STRUCTURE IN A SEMICONDUCTOR DEVICE

[75] Inventor: Craig S. Lage, Austin, Tex.

[73] Assignee: Motorola, Inc., Schaumburg, Ill.

[21] Appl. No.: 25,459

[22] Filed: Mar. 3, 1993

[51] Int. Cl.$^5$ .................... H01L 21/70; H01L 27/00
[52] U.S. Cl. ................................ 437/52; 437/189; 437/193; 437/200; 437/915
[58] Field of Search .................. 437/52, 60, 918, 919, 437/189, 193, 200, 195, 915; 257/67–69, 903–904, 379–381

[56] References Cited

U.S. PATENT DOCUMENTS

| 4,994,873 | 2/1991 | Madan | 357/23.5 |
| 5,173,450 | 12/1992 | Wei | 437/200 |
| 5,187,122 | 2/1993 | Bouis | 437/200 |
| 5,212,399 | 5/1993 | Manning | 257/369 |
| 5,215,932 | 6/1993 | Manning | 437/41 |

Primary Examiner—Olik Chaudhuri
Assistant Examiner—H. Jey Tsai
Attorney, Agent, or Firm—Jasper W. Dockrey

[57] ABSTRACT

A process for fabricating stacked gate structures (10, 11) and local interconnects (50, 52), in which portions (32, 34) of the thin-film channel layers (20, 22) are exposed by etching away portions of overlying insulating layers (28, 30). A masking layer (40) is formed to overlie the thin-film channel layers (20, 22) and the insulation layers (28, 30), and openings (42, 44) are formed in the insulation layer (40). The openings (42, 44) expose the exposed portions (32, 34) of the thin-film layers (20, 22) and portions (46, 48) of the substrate (12). Interconnects pads (50, 52) are formed to overlie the masking layer (40) and electrically contact the exposed portions of the thinfilm layers (20, 22) and the exposed portions (46,48) of the substrate (12). In regions where the insulation layers (28, 30) have not been removed, an interconnect pad (52) electrically contacts only a portion (48) of the substrate (12). In regions where insulation layers (28, 30) are removed, an interconnect pad (50) electrically contacts both the thin-film channel layer (22) and a portion (46) of the substrate (12).

6 Claims, 3 Drawing Sheets

PROCESS FOR FABRICATING A SELF ALIGNED INTERCONNECT STRUCTURE IN A SEMICONDUCTOR DEVICE

FIELD OF THE INVENTION

The invention relates to the process for fabricating semiconductor memory devices, and more particularly, to a process for fabricating a six transistor SRAM memory cell.

BACKGROUND OF THE INVENTION

As semiconductor devices become smaller, it becomes necessary to fabricate individual components within a device such that minimal separation distances are achieved. The need to design compact component arrangements occurs most significantly in memory devices. Because of the large number of components needed to fabricate a typical dynamic random access-memory device (DRAM), or static random access memory device (SRAM), the components must be arranged compactly if the overall device dimensions are not to become excessively large. This problem is especially critical in some SRAM devices where a typical individual memory cell contains as many six separate transistors.

One important technique for fabricating an SRAM cell having a small surface area is to stack metal-oxide-semiconductor MOS transistors in a vertical arrangement. Typically, a first transistor is formed in a substrate having source, drain, and channel regions in the substrate, and a gate electrode overlying the substrate surface. Then, a second transistor is formed in a thin-film layer, usually polycrystalline silicon, overlying the first transistor. The advantage of polysilicon transistors for use in SRAM memory cells has been known for quite some time. This type of cell generally has four N-Channel transistors formed in the substrate with two P-channel transistors formed in the second layer of polysilicon. The two P-channel transistors act as load devices in place of the commonly used resistor. The P-channel transistors reduce power consumption while also improving cell stability. These advantages can also be obtained by forming P-channel load devices in the substrate, but this results in a significant increase in the amount of surface area required for the cell.

While the fabrication of a six transistor SRAM memory cell having load devices formed in a layer of polysilicon reduces the overall area of the memory cell, this fabrication technique often requires several additional layers of material. As the height of the cell is increased it becomes more difficult to form reliable metal interconnections to the memory cell. The metal interconnections must be formed by depositing a layer of metal overlying the cell, then patterning the metal layer to form individual leads. Within the cell, the steep topography created by the material layers used to form the polysilicon load devices can cause voids to develop during the etching process used to form the metal leads. Once a void forms, the lead can no longer provide an electrical connection to the device resulting in device failure. It is therefore especially beneficial if the interconnect metallization can be formed over a relatively planar SRAM cell.

SUMMARY OF THE INVENTION

The present invention includes a process for fabricating a semiconductor device. In one aspect, the invention can be advantageously used to form a six transistor SRAM memory cell having thin-film load devices. In one embodiment, a substrate having a stacked gate structure is provided. The stacked structure includes a thin-film channel layer overlying a shared-gate electrode. The thin-film channel layer and the shared-gate electrode are separated by an intermediate dielectric layer. An insulation is formed to overlie the thin-film channel layer. Etching the stacked structure to form a stacked gate electrode and portions of the insulation layer are removed to expose selected portions of the thin-film channel layer. A masking layer is then formed over the stacked gate structure and the exposed portions of the thin-film channel layer. Portions of the masking layer are removed to expose the selected portions of the thin-film channel layer and portions of the substrate surface. Finally, an interconnect layer is formed to overlie the masking layer. The interconnect layer contacts the exposed portion of the thin-film channel layer and portions of the substrate surface exposed during the etching process.

By selectively removing portions of the insulation layers overlying the thin-film channel layers, a blanket metal interconnect layer can be deposited in which certain portions will electrically contact the substrate and other portions will electrically contact both the substrate and the thin-film channel layer. After patterning the interconnect layer, individual interconnects provide bonding sites in which VSS and VCC signals can be introduced to the memory cell. The fabrication process carried out in accordance with the invention provides a six transistor memory cell in two semiconductor layers and one interconnect layer.

Figure 1:
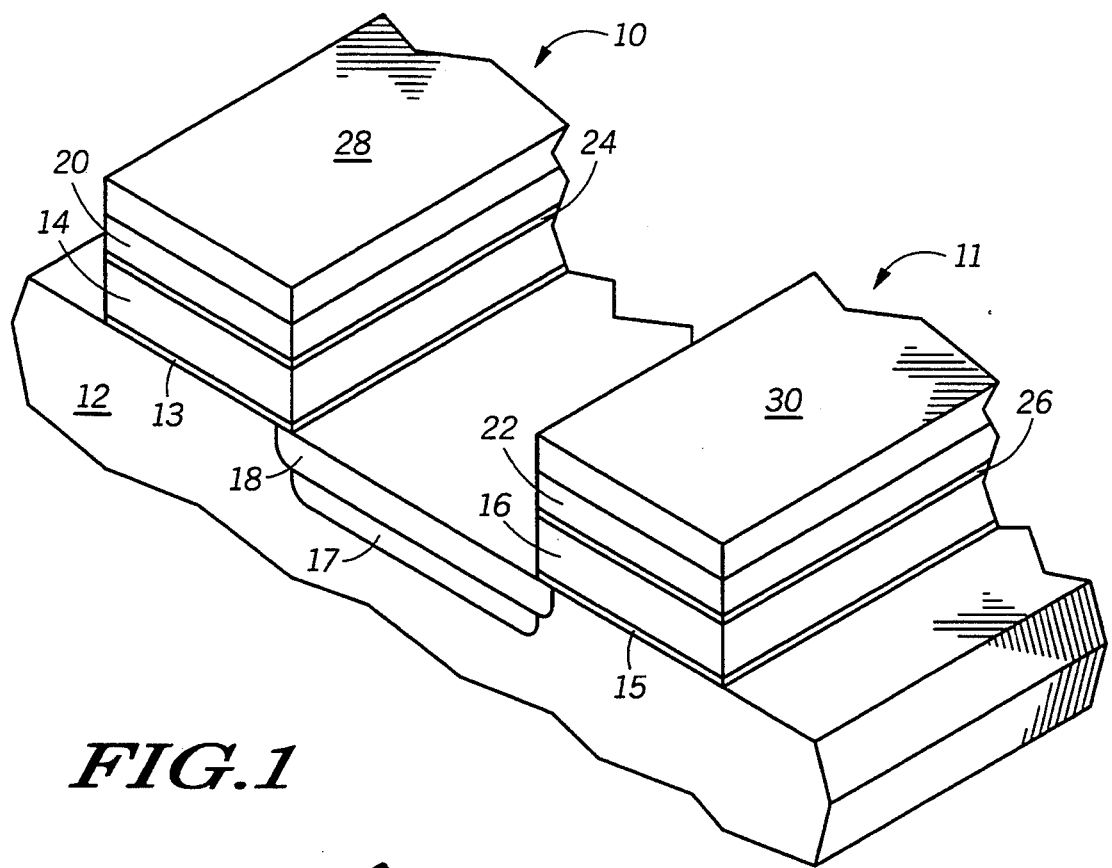
FIGS. 1–5, illustrate, in perspective view, process steps in accordance with the invention.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

DETAILED DESCRIPTION OF PREFERRED EMBODIMENTS

The stacked gate and interconnect structures, fabricated in accordance with the invention, are applicable to a wide range of integrated circuit devices. The stacked gate structures are especially applicable to a static-random-access memory (SRAM) device fabricated using MOS technology. It will be appreciated, however, that the stacked gate structures fabricated using the process disclosed herein are applicable to other devices and to other technologies. The process in accordance with the invention is illustrated by the fabrication of a portion of an integrated circuit device. FIG. 1, illustrates, in perspective view, the initial structure of a portion of such an integrated circuit device at an early stage in the process of fabricating a pair of inverters. The inverters can be components of an MOS memory device, a bipolar-complementary-MOS (BiCMOS) memory device, a logic device, and the like. The process of the present invention advantageously forms an inverter and electrical interconnect in two layers of semiconductor material and one layer of interconnect material. The process further provides a self-aligned contact to thin-film source and drain regions by a local interconnect layer.

Shown in FIG. 1, is a portion of a semiconductor device having undergone several process steps in accordance with the invention. A pair of stacked-gate structures 10 and 11 overlie a portion of a semiconductor substrate 12. Stacked-gate structures 10 and 11 are separated from substrate 12 by gate dielectric layers 13 and 15, respectively. First and second shared-gate electrodes 14 and 16 overlie substrate 12 and are spaced apart by implanted drain regions 17 and 18, of which region 17 is heavily doped and region 18 is lightly doped. First and second thin-film channel layers 20 and 22 overlie shared-gate electrodes 14 and 16 respectively and are separated from shared-gate electrodes 14 and 16 by dielectric layers 24 and 26, respectively. Insulating layers 28 and 30 overlie thin-film channel layers 20 and 22, respectively. In one embodiment, the stacked-gate structures illustrated in FIG. 1 comprise the shared-gate electrode and channel region for two logic inverters, each residing in a different memory cell. The inverters each have a thin-film load transistor overlying a bulk driver transistor. The transistors share a common gate electrode, shared-gate electrodes 14 and 16, and a common source region, implanted drain regions 17 and 18.

Implanted drain regions 17 and 18 are preferably created by first forming sidewall spacers on stacked gates 10 and 11, then ion implanting a high concentration of dopant atoms into substrate 12 to form a heavily-doped region 17. Heavily-doped region 17 is self-aligned to the edge of the sidewall spacers. The sidewall spacers are removed and a second ion implant process is carried out to form a lightly-doped region 18, which is self-aligned to the edges of stacked gates 11 and 12. Insulation layers 28 and 30 prevention implanted dopants from entering thin-film channel layers 20 and 22, respectively.

To form high quality inverters, it is important to avoid exposing implanted drain regions 17 and 18 to high temperatures once the dopant atoms have been implanted and activated in substrate 12. Exposure of the implanted drain regions to high temperatures, such as that necessary to oxidize silicon, will cause the dopants to diffuse further into substrate 12. The unwanted diffusion of dopant atoms will degrade the performance characteristics of the bulk transistors. In the process of the present invention, implanted drain regions 17 and 18 are created after the dielectric components of stacked gates 10 and 11 have been formed. Forming dielectric layers 24 and 26 for the thin-film transistors prior to forming the implanted drain regions of the bulk transistor avoids exposing the implanted drain regions to the high-temperature processing required to form dielectric layers 24 and 26.

Figure 2:
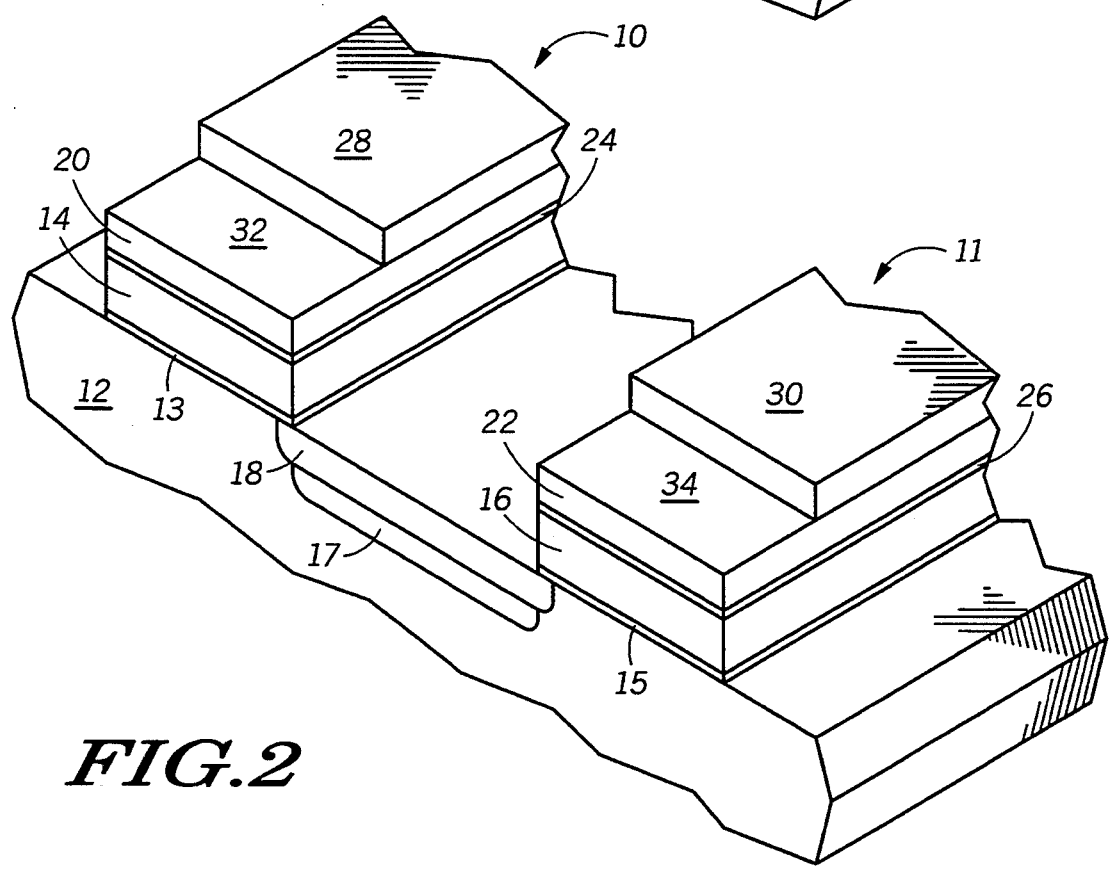

The process continues, as illustrated in FIG. 2, with the removal of a portion of insulating layers 28 and 30. Preferably, the portions of insulating layers 28 and 30 are removed by photolithographic processing and anisotropic etching. The anisotropic etching process exposes a portion 32 and a portion 34 of thin-film channel layers 20 and 22, respectively. Once the portions of insulation layers 28 and 30 are removed, source and drain regions are formed in exposed portions 32 and 34 of thin-film channel layers 20 and 22. In one embodiment, exposed portions 32 and 34 are doped by ion implantation using insulation layers 28 and 30 as a doping mask.

Figure 3:
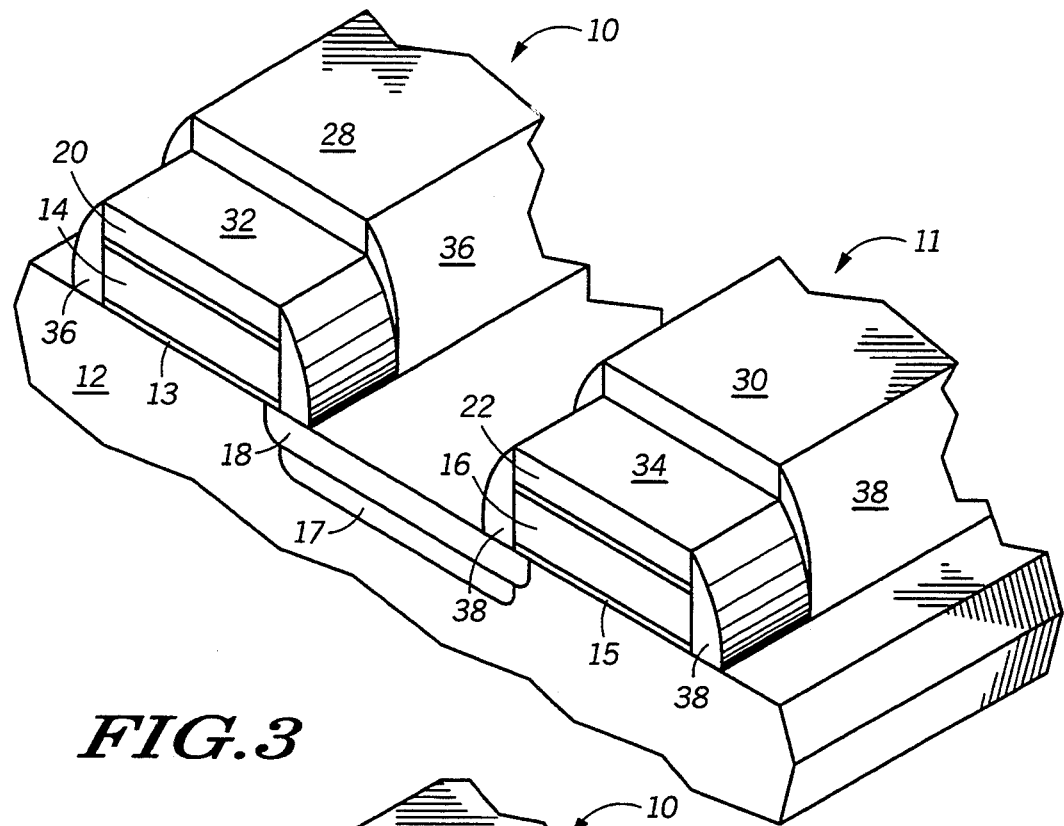

Following the doping of exposed portions 32 and 34, sidewall spacers 36 and 38 are formed on shared-gates 14 and 16 respectively, as illustrated in FIG. 3. Sidewall spacers 36 and 38 are preferably formed by chemical vapor deposition of silicon nitride, followed by anisotropic etching. Alternatively, sidewall spacers 36 and 38 can be formed with another insulating material which is differentially etchable with respect to insulation layers 28 and 30, and exposed portions 32 and 34.

Figure 4:
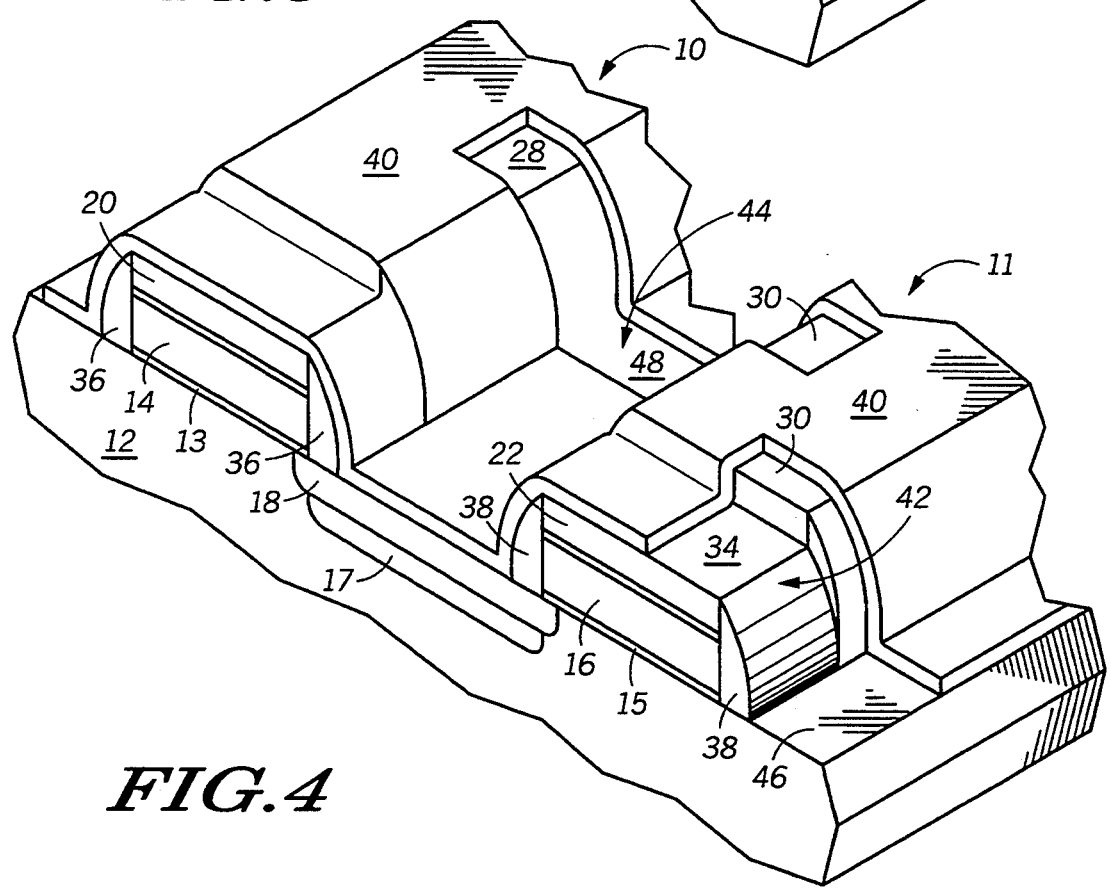

After sidewall spacers 36 and 38 have been formed, a masking layer 40 is deposited to overlie shared-gates 14 and 16, and the surface of substrate 12, as shown in FIG. 4. Preferably, masking layer 40 is silicon dioxide conformally deposited by chemical vapor deposition. Alternatively, masking layer 40 can be another insulating material which can be etched selectively to sidewall spacers 36 and 42 and substrate 12. After forming masking layer 40, a photolithographic and ion etching process are carried out to form openings 42 and 44 in masking layer 40. Opening 42 exposes a portion of exposed region 34 of channel layer 23 and a portion of insulation layer 30. Opening 42 also exposes a portion of sidewall spacer 38 and a portion 46 of substrate 12 adjacent to sidewall spacer 38. Opening 44 exposes a portion of insulation layers 28 and 30, and a portion 48 of substrate 12 intermediate to shared-gates 14 and 16. During the etching process used to form openings 42 and 44, any oxide layers overlying the surface of substrate 12 in exposed portions 46 and 48 are also removed.

Figure 5:
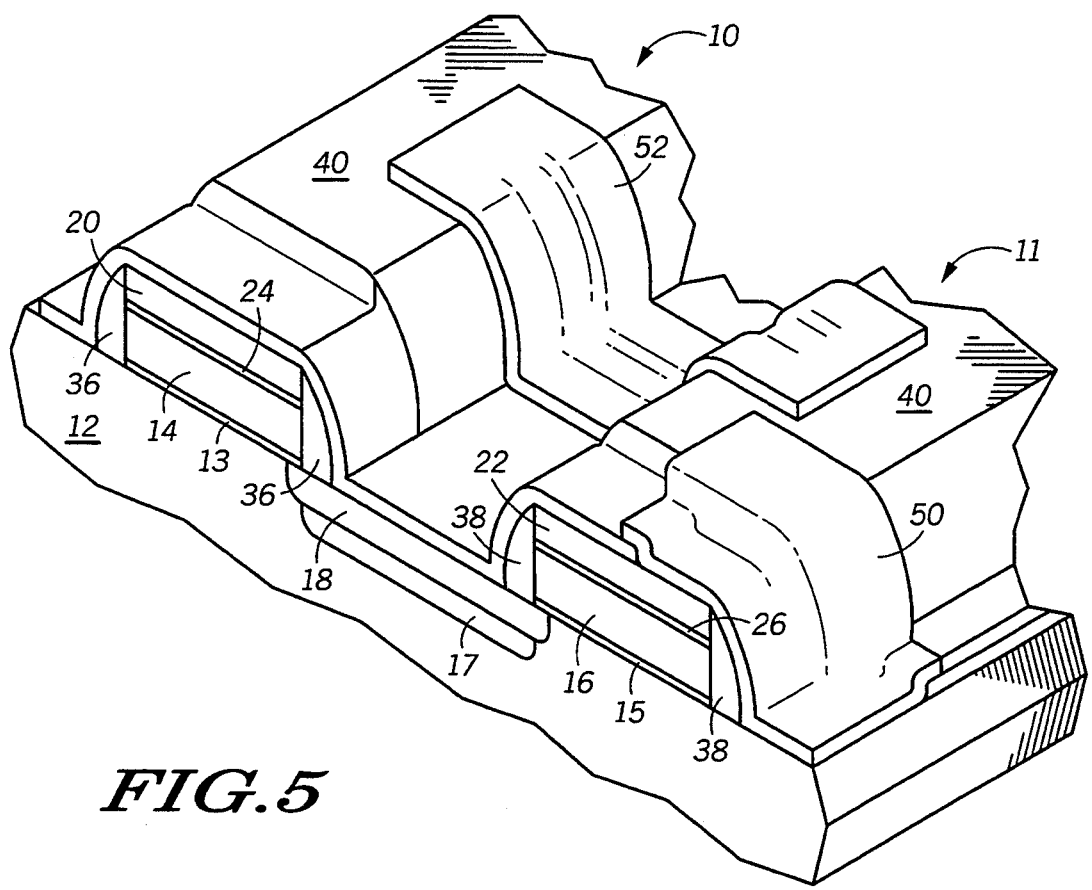

The inventive process continues with the formation of interconnect pads 50 and 52, as illustrated FIG. 5. Interconnect pads 50 and 52 are preferably formed by the deposition of an electrically conductive material, followed by photolithographic patterning and ion etching. In one embodiment, interconnect pads 50 and 52 can be formed by the RF sputter deposition of titanium, followed by rapid thermal annealing in a nitrogen ambient. The annealing process initiates a chemical reaction between the titanium layer and underlying silicon layers, and between titanium and the nitrogen ambient. Because the reaction with crystalline silicon proceeds much faster than the reaction with nitrogen, titanium silicide is formed in regions where the titanium layer overlies a silicon surface, such as exposed portions 46 and 48 of substrate 12. Whereas, titanium nitride is formed in regions where the titanium layer overlies an insulating material, such as silicon oxide and silicon nitride. Alternatively, interconnect pads 50 and 52 can be formed by the deposition, masking, and etching of a layer of polycrystalline silicon. Other materials can be a refractory metal, a refractory metal silicide, and the like. As illustrated in FIG. 5, interconnect pad 50 forms an electrical connection between thin-film channel layer 22 and substrate 12. Interconnect pad 52 forms an extended contact land. The land provides an accessible bonding site for an overlying metal layer carrying a VSS signal to the memory cell.

Those skilled in the art will recognize that precise photolithographic alignment of the pattern used to form interconnect pads 50 and 52 is not required. The partial removal of insulation layer 30, overlying thin-film channel layer 22, and the selected placement of openings 42 and 44, enables interconnect pad 50 to form a self aligned interconnect between thin-film channel layer 22 and substrate 12.

The stacked-gate structure having a shared-gate electrode, an overlying thin-film channel, and interconnect pads can be advantageously used in an SRAM memory cell. For example, interconnect pad 50 can be used to form a localized electrical connection between the drain of a thin-film load transistor and the drain of an underlying driver transistor. In cases where the oxide layer overlying substrate 12 is not removed, interconnect pad 50 can be used to electrically couple a metal lead carrying a VCC power supply signal to thin-film channel layer 22. Similarly, interconnect pad 52 can be used to electrically couple a VSS signal to substrate 12.

The structure illustrated in FIG. 5 advantageously provides a six transistor SRAM cell having the major components substantially formed in two semiconductors layers and one interconnect layer. Additionally, the formation of the masking layer exposing preselected portions of the thin-film channel layers and substrate permits the interconnect pads 50 and 52 to be formed by a non-critical photolithographic alignment. Thus, the self aligned contact structure illustrated in FIG. 5 permits the formation of a six transistor SRAM cell having the low topographic profile.

Thus it is apparent that there has been provided, in accordance with the invention, a process for forming a semiconductor device which fully meets the advantages above. Although the invention has been described and illustrated with reference to specific illustrative embodiments thereof, it is not intended that the invention be limited to those illustrative embodiments. Those skilled in the art will recognize variations and modifications can be made without departing the from the spirit of the invention. For example, different dielectric materials can be used to form the dielectric layers. The dielectric layers can be a composite material including a layer of silicon nitride formed between two layers of silicon dioxide (ONO). Furthermore, the contact structure can be used in other kinds of devices such as logic devices, simple inverter components, and the like. It is therefore intended to include within the invention all such variations and modifications as fall within the scope and appended claims and equivalence thereof.

I claim:

1. A process for fabricating a semiconductor device comprising the steps of:
   providing a semiconductor substrate having a gate oxide layer thereon;
   forming a first polysilicon layer overlying the gate oxide layer;
   forming a dielectric layer overlying the first polysilicon layer;
   forming a second polysilicon layer overlying the dielectric layer;
   forming an insulating layer overlying the second polysilicon layer;
   etching the insulating layer, the second polysilicon layer, the dielectric layer and the first polysilicon layer to form a stacked gate;
   etching away a portion of the insulating layer to expose selected portions of the second polysilicon layer;
   depositing a dielectric masking layer overlying the stacked gate;
   etching the masking layer to form openings therein exposing the selected portions of the second polysilicon layer and portions of the substrate; and
   forming an interconnect layer overlying the masking layer and filling the openings.

2. The process of claim 1 further comprising the steps of implanting the selected portions of the second polysilicon layer prior to depositing the dielectric mask.

3. The process of claim 1, wherein the step of forming an interconnect layer comprises the steps of:
   sputter depositing a layer of titanium onto the masking layer;
   annealing the titanium in a nitrogen ambient to form titanium silicide in regions overlying the selected portions of the thin-film channel layer and the portions of the substrate, and titanium nitride in regions overlying the masking layer; and
   etching away the portions of the titanium nitride overlying the masking layer and leaving portions of the interconnect layer to electrically couple the selected portions of the second polysilicon layer to the substrate, and to provide an extended region for electrical contact to the substrate.

4. The process of claim 1, wherein the step of forming an interconnect layer comprises depositing a layer selected from the group consisting of polycrystalline silicon, a refractory metal, and a refractory metal silicide.

5. The process of claim 1 further comprising the step of forming a sidewall spacer on the stacked gate prior to depositing the masking layer.

6. The process of claim 5, wherein the step of forming a sidewall spacer comprises the steps of:
   depositing a layer of silicon nitride; and
   anisotropically etching the silicon nitride.

* * * * *